US012606914B2

(12) United States Patent
Tanuma et al.

(10) Patent No.: US 12,606,914 B2
(45) Date of Patent: Apr. 21, 2026

(54) ELECTRODE FILAMENT CONNECTION MEMBER, CHEMICAL VAPOR DEPOSITION APPARATUS, AND METHOD FOR MANUFACTURING RECORDING MEDIUM SUBSTRATE

(71) Applicant: SHOWA DENKO K.K., Tokyo (JP)

(72) Inventors: Hiromitsu Tanuma, Yamagata (JP); Shinichi Nakayama, Yamagata (JP); Nor Razali Rohman Mumod Ali, Singapore (SG); Kok Sheng Lim, Singapore (SG)

(73) Assignee: Resonac Hard Disk Corporation, Chiba (JP)

( * ) Notice: Subject to any disclaimer, the term of this patent is extended or adjusted under 35 U.S.C. 154(b) by 344 days.

(21) Appl. No.: 18/048,982

(22) Filed: Oct. 24, 2022

(65) Prior Publication Data

US 2023/0133485 A1     May 4, 2023

(30) Foreign Application Priority Data

Oct. 28, 2021    (JP) ................................. 2021-176218

(51) Int. Cl.
*C01B 33/035* (2006.01)
*C23C 16/509* (2006.01)

(52) U.S. Cl.
CPC ................................. *C23C 16/509* (2013.01)

(58) Field of Classification Search
None
See application file for complete search history.

(56) References Cited

U.S. PATENT DOCUMENTS

2010/0028563 A1* 2/2010 Ota ........................ C23C 16/503
                                                          427/580
2013/0011581 A1* 1/2013 Muller .............. H01J 37/32477
                                                          118/500
2013/0115374 A1* 5/2013 Jayakar ............... C23C 16/4418
                                                          427/255.18

(Continued)

FOREIGN PATENT DOCUMENTS

CN        110241390        9/2019
JP        2000-222724      8/2000

(Continued)

*Primary Examiner* — Mandy C Louie
(74) *Attorney, Agent, or Firm* — IPUSA, PLLC

(57)                    ABSTRACT

An electrode filament connection member configured to be attached so as to pass through an outer wall of a chemical vapor deposition apparatus in which an electrode filament is disposed in a chamber is provided, and to form an electrical connection between a wire from a power source and the electrode filament. The electrode filament connection member includes a head portion attached to the electrode filament, and a rod portion that extends through the outer wall and is connected to the wire. The head portion includes an electrode filament attachment portion at a tip end portion, and a side surface that is parallel to an axial direction or is gradually widened from the tip end portion toward the outer wall. An outer shape of the side surface of the head portion conforms to an outer shape of the electrode filament connection member when viewed in projection along the axial direction.

5 Claims, 7 Drawing Sheets

(56)            References Cited

U.S. PATENT DOCUMENTS

| | | | |
|---|---|---|---|
| 2016/0122875 A1 * | 5/2016 | Kelly | ..................... C23C 16/46 |
| | | | 118/500 |
| 2017/0341944 A1 | 11/2017 | Ishida | |
| 2020/0263304 A1 * | 8/2020 | Hoshino | ................. C23C 16/24 |
| 2021/0269316 A1 * | 9/2021 | Ishikawa | .............. C01B 33/035 |

FOREIGN PATENT DOCUMENTS

| | | | |
|---|---|---|---|
| JP | 2006-057172 | 3/2006 | |
| JP | 2010-027175 | 2/2010 | |
| JP | 2014-114492 | 6/2014 | |
| WO | 2016/024361 | 2/2016 | |
| WO | WO-2016072077 A1 * | 5/2016 | ......... C23C 16/4418 |

* cited by examiner

ELECTRODE FILAMENT CONNECTION MEMBER, CHEMICAL VAPOR DEPOSITION APPARATUS, AND METHOD FOR MANUFACTURING RECORDING MEDIUM SUBSTRATE

CROSS-REFERENCE TO RELATED APPLICATIONS

This application is based on and claims priority to Japanese Patent Application No. 2021-176218, filed on Oct. 28, 2021, the entire contents of which are incorporated herein by reference.

BACKGROUND OF THE INVENTION

1. Field of the Invention

The disclosure herein relates to an electrode filament connection member, a chemical vapor deposition apparatus, and a method for manufacturing a recording medium substrate.

2. Description of the Related Art

Chemical vapor deposition (CVD) methods are methods for forming films on surfaces of substrates by chemical reaction in vapor phase. The CVD methods are suitable for mass production and are widely used because only a relatively small apparatus is required for production, the film formation speed is high, and the composition and the thickness of films formed can be controlled with high accuracy.

Examples of such CVD methods include CVD methods using electrode filaments such as a hot filament CVD method and a hot filament-plasma CVD method. In the CVD methods using the electrode filaments, an electrode filament connection member is used to connect a wire from a power source provided outside a chamber and an electrode filament provided inside the chamber.

For example, Patent Document 1 describes an electrode filament connection member that connects a wire from a cathode power source and a cathode filament provided inside a chamber.

FIG. 7 is a cross-sectional view illustrating a configuration of a conventional electrode filament connection member. As illustrated in FIG. 7, an electrode filament connection member 7 includes a head portion 71 having a cylindrical shape, a collar portion 72 having a disk shape, and a rod portion 73 having a cylindrical shape. The collar portion 72 is provided at an end of the head portion 71 and has a diameter larger than that of the head portion 71. The rod portion 73 extends from the collar portion 72 to the side opposite to the head portion 71, and has a diameter smaller than that of the collar portion 72.

In a CVD apparatus, the head portion 71 is located inside a chamber, and an electrode filament is attached to one end of the head portion 71. With the electrode filament being attached, the collar portion 72 functions as an umbrella that prevents solids produced in the chamber from adhering to the attachment portion of the electrode filament connection member 7. The rod portion 73 passes through the outer wall of the chamber, and a wire from a power source is connected to a part, on the outside of the chamber, of the rod portion 73.

Patent Document 2 describes a socket that passes through a vacuum chamber wall and connects a cathode and a power source. The surface of the socket of Patent Document 2 is roughened by metal spraying or the like in order to prevent a carbon film adhering to the surface of the socket from peeling off.

However, such CVD methods using an electrode filament have a problem in that solids produced in a chamber, such as a component derived from a source gas, adhere to an electrode filament connection member, are deposited on the electrode filament connection member, and fall off within the chamber. For conventional electrode filament connection members as illustrated in Patent Document 1 and FIG. 7, solids may get deposited in a recess 74 between the head portion 71 and the collar portion 72, may develop into a large lump, and in turn may fall off.

In the socket of Patent Document 2, there is room for improvement in preventing deposition and falling-off of solids produced in the chamber.

RELATED-ART DOCUMENTS

Patent Documents

Patent Document 1: WO 2016/024361
Patent Document 2: Japanese Laid-open Patent Publication No. 2000-222724

SUMMARY OF THE INVENTION

It is desirable to provide an electrode filament connection member, a CVD apparatus, and a method for manufacturing a recording medium substrate that can prevent solids produced in a chamber from being deposited and falling off when a film is formed on a substrate in the chamber by a CVD method using an electrode filament.

One aspect of the present disclosure provides an electrode filament connection member for attaching to a chemical vapor deposition apparatus so as to pass through an outer wall of the chemical vapor deposition apparatus in which an electrode filament is disposed in a chamber defined by the outer wall. The electrode filament connection member forms an electrical connection between a wire from a power source provided outside the chamber and the electrode filament. The electrode filament connection member includes a head portion that is provided in the chamber and attached to the electrode filament; and a rod portion that extends from the head portion through the outer wall so as to be connected to the wire. The head portion includes an electrode filament attachment portion at a tip end portion, and a side surface that is parallel to an axial direction or is gradually widened from the tip end portion toward the outer wall. The rod portion passes through the outer wall in the axial direction. An outer shape of the side surface of the head portion conforms to an outer shape of the electrode filament connection member when viewed in projection along the axial direction.

Another aspect of the present disclosure provides a chemical vapor deposition apparatus in which an electrode filament is disposed in a chamber defined by an outer wall. The chemical vapor deposition apparatus includes an electrode filament connection member configured to pass through the outer wall and to electrically connect a wire from a power source provided outside the chamber and the electrode filament. The electrode filament connection member includes a head portion that is provided in the chamber and attached to the electrode filament, and a rod portion that extends from the head portion through the outer wall so as to be connected to the wire. The head portion includes an electrode filament attachment portion at a tip end portion, and a side surface that is parallel to an axial direction or is gradually widened from the tip end portion toward the outer wall. The rod portion passes through the outer wall in the axial direction. An outer shape of the side surface of the head portion conforms to an outer shape of the electrode filament connection member when viewed in projection along the axial direction.

Yet another aspect of the present disclosure provides a method for manufacturing a recording medium substrate. The method includes performing a film deposition process by a chemical vapor deposition apparatus in which an electrode filament is disposed in a chamber defined by an outer wall. The chemical vapor deposition apparatus includes an electrode filament connection member configured to be attached so as to pass through the outer wall and to electrically connect a wire from a power source located outside the chamber and the electrode filament. The electrode filament connection member includes a head portion that is provided in the chamber and attached to the electrode filament, and a rod portion that extends from the head portion through the outer wall so as to be connected to the wire. The head portion includes an electrode filament attachment portion at a tip end portion, and a side surface that is parallel to an axial direction or is gradually widened from the tip end portion toward the outer wall. The rod portion passes through the outer wall in the axial direction. An outer shape of the side surface of the head portion conforms to an outer shape of the electrode filament connection member when viewed in projection along the axial direction.

BRIEF DESCRIPTION OF THE DRAWINGS

Other objects and further features of the present invention will be apparent from the following detailed description when read in conjunction with the accompanying drawings, in which.

DESCRIPTION OF THE EMBODIMENTS

Figure 1:
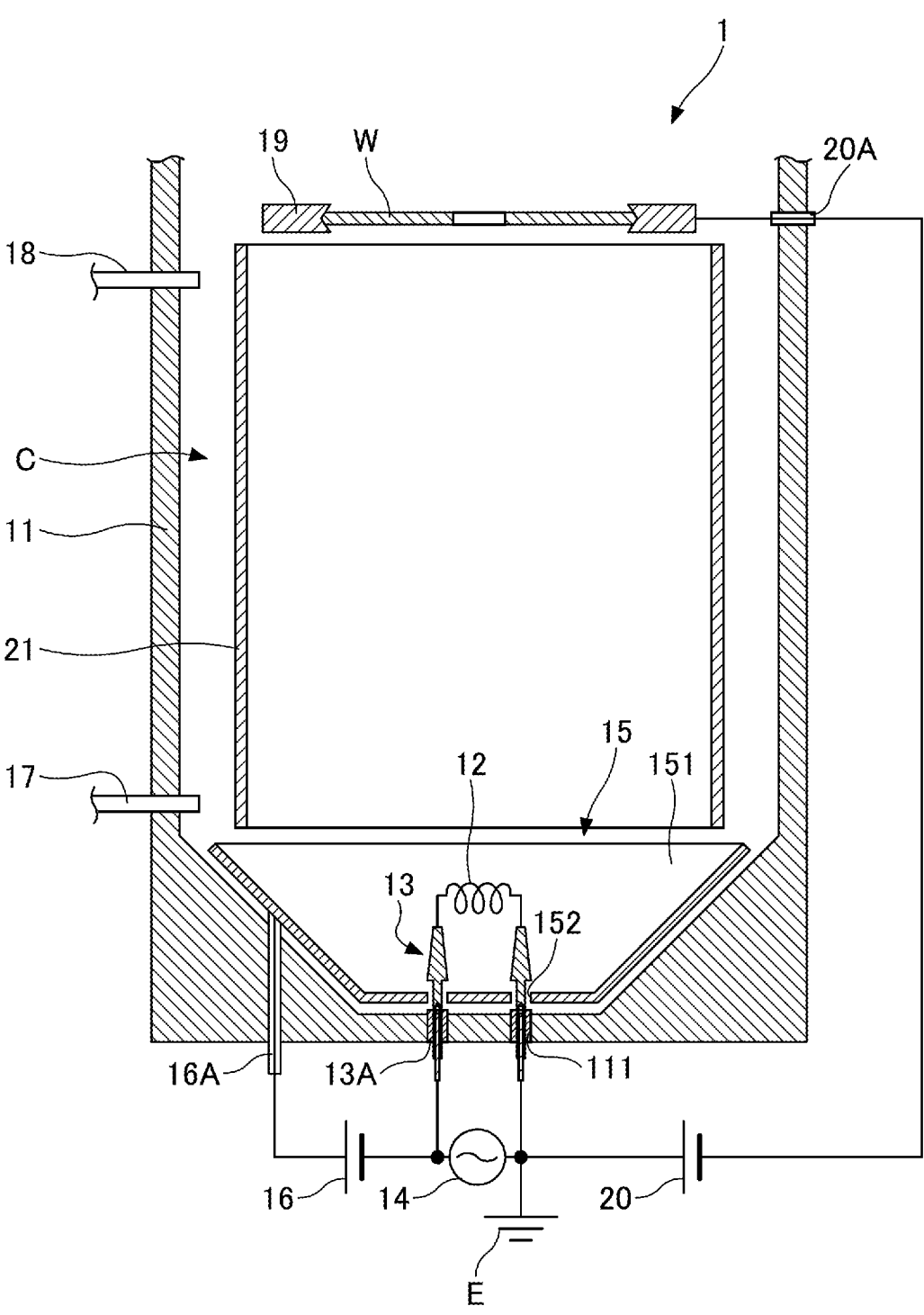
FIG. 1 is a diagram schematically illustrating an example of a CVD apparatus according to an embodiment of the present invention.

In the following, embodiments of the present invention will be described in detail. In order to facilitate understanding of the description, the same components in the drawings are designated by the same reference numerals, and the description thereof will not be repeated. In addition, the components in the drawings may not be to scale. As used herein, "to" indicating a numerical range means that the numerical range includes numerical values given before and after "to" as its lower limit value and its upper limit value, unless otherwise specified.

In the following embodiments, an electrode filament is disposed in a chamber defined by the outer wall of a CVD apparatus. An electrode filament connection member is configured to be attached to the CVD apparatus so as to pass through the outer wall of the CVD apparatus, and to electrically connect a wire from a power source provided outside the chamber and the electrode filament. In the following description, the electrode filament connection member is a cathode filament socket of a hot filament-plasma CVD apparatus, but can be applied to any other CVD apparatus as long as a method using a filament is used.

1. CVD Apparatus

1-1. Apparatus Configuration

FIG. 1 is a diagram schematically illustrating an example of a CVD apparatus according to an embodiment of the present invention. A CVD apparatus 1 is an apparatus configured to perform a film deposition process on a substrate W in a chamber C. The shape of the substrate W is not particularly limited, but may be, for example, a disk shape. The CVD apparatus 1 according to the present embodiment can perform the film deposition process on both surfaces of the substrate W, and substantially the same components, which will be described later, in the chamber C are provided on both sides of the substrate W; however, FIG. 1 depicts components provided at one side of the substrate W. Note that the CVD apparatus 1 may be configured to perform the film deposition process on only one surface of the substrate W.

As illustrated in FIG. 1, the CVD apparatus 1 includes an outer wall 11, a cathode filament 12, which is an electrode filament, filament sockets 13, each of which is an electrode filament connection member, a cathode power source 14, which is a power source, an anode 15, an anode power source 16, a gas introduction port 17, a gas exhaust port 18, a substrate holder 19, an ion acceleration power source 20, and an inner shield 21. The CVD apparatus 1 may include any other components as necessary.

The chamber C, which is an airtight interior space, is defined by the outer wall 11. The chamber C defined by the outer wall 11 houses the cathode filament 12, the anode 15, the substrate holder 19, and the substrate W. The film forming process is performed on the substrate W in the chamber C. Any other components may be housed in the chamber C as necessary. As will be described later in detail, the outer wall 11 has socket attachment holes 111 through which the filament sockets 13 pass.

The cathode filament 12 may be composed of one wire or may be composed of a plurality of wires. If the cathode filament 12 is composed of a plurality of wires, the cathode filament 12 is preferably composed of stranded wires. The material of the cathode filament 12 may be, for example, tungsten or the like, but is not limited thereto.

The filament sockets 13 are attached to the outer wall 11 in a state in which the filament sockets 13 pass through the socket attachment holes 111 of the outer wall 11. The filament sockets 13 electrically connect the cathode filament 12 in the chamber C and a wire from the cathode power source 14. The two filament sockets 13 are provided, and the filament sockets 13 electrically connect respective ends of the cathode filament 12 separately to the wire from the cathode power source 14 provided outside the chamber C.

The filament sockets 13 are attached to the outer wall 11 such that airtightness in the chamber C can be maintained. In the present embodiment, the filament sockets 13 are conductors. Specifically, the material of the filament sockets 13 is preferably copper or the like. Each of the filament sockets 13 and the outer wall 11 is electrically insulated by an insulating member 13A. Examples of the insulating member include an insulator. The filament sockets 13 will be described later in detail with reference to FIG. 2.

The cathode power source 14 is an alternating current power source. The voltage of the cathode power source 14 is preferably in a range from 100V to 300V, but is not limited to this range. Terminals of the cathode power source 14 are connected to the respective filament sockets 13. With this configuration, an alternating voltage is applied to the cathode filament 12, and the cathode filament 12 is heated by a current flowing therethrough. One of the terminals of the cathode power source 14 is connected to earth E.

The anode 15 includes an anode plate 151. The anode plate 151 surrounds the cathode filament 12, and the side, closer to the substrate W, of the anode plate 151 is open. The anode plate 151 has a tapered shape that widens toward the substrate W. The anode plate 151 may have a curved surface. The anode plate 151 is electrically insulated from the outer wall 11. In the example of FIG. 1, the anode plate 151 also covers the vicinity of portions, to which the filament sockets 13 are attached, of the inner surface of the outer wall 11. In this example, the anode plate 151 has through holes 152 such that the anode plate 151 does not contact the filament sockets 13, as will be described later in detail.

The anode power source 16 is a direct current power source. The voltage of the anode power source 16 is preferably in a range from OV to 300V, but is not limited to this range. A positive electrode of the anode power source 16 is connected to the anode 15, and a negative electrode of the anode power source 16 is connected to the other terminal, which is not connected to the earth E, of the cathode power source 14. A wire that connects the anode 15 and the anode power source 16 is electrically insulated from the outer wall 11 by an insulating member 16A.

The gas introduction port 17 introduces a source gas from an external gas supply source (not illustrated) into the chamber C. In the present embodiment, examples of the source gas include an organic compound. Examples of the organic compound include, but are not limited to, hydrocarbons such as methane, ethane, benzene, and toluene.

The gas exhaust port 18 exhausts the gas in the chamber C to the outside. The pressure in the chamber C is controlled by the gas exhaust port 18. A device that controls the pressure in the chamber C is not particularly limited, but may be a pump or the like.

The substrate holder 19 holds the substrate W in the chamber C. The substrate holder 19 may be configured to move the position of the substrate W by being equipped with a drive device (not illustrated). The substrate W may be moved in the vertical direction or the horizontal direction with respect to the surface of the substrate, or may be moved in a direction oblique to the vertical direction or the horizontal directions.

The ion acceleration power source 20 is a direct current power source. The voltage of the ion acceleration power source 20 is preferably in a range from 50V to 1000V, but is not limited to this range. Further, the voltage of the ion acceleration power source 20 may be appropriately varied according to the progress of a process. A positive electrode of the ion acceleration power source 20 is connected to the earth E, and a negative electrode of the ion acceleration power source 20 is connected to the substrate W. A wire connecting the ion acceleration power source 20 to the substrate W may be attached to the inside of the substrate holder 19. The wire connecting the ion acceleration power source 20 to the substrate W is electrically insulated from the outer wall 11 by an insulating member 20A.

The inner shield 21 covers the inner surface of the outer wall 11 between the anode plate 151 and the substrate W. The inner shield 21 prevents solids produced in the chamber C from adhering to the inner surface of the outer wall 11. The inner shield 21 is spaced apart from the anode plate 151. In this example, the source gas entering from the gas introduction port 17 flows between the inner shield 21 and the anode plate 151 and enters the chamber C. The inner shield 21 preferably has a floating potential.

1-2. Operation of Apparatus

With the above-described configuration, the cathode filament 12 generates heat by a current supplied from the cathode power source 14. The heat generated by the cathode filament 12 and discharge between the cathode filament 12 and the anode 15 cause the source gas to be converted into a plasma. The substrate W has a negative potential by the ion acceleration power source 20. Therefore, the plasma is accelerated toward the substrate W and collides with the surface of the substrate W, thereby causing a film including a component derived from the source gas to be formed on the surface of the substrate W.

2. Filament Socket

Figure 2:
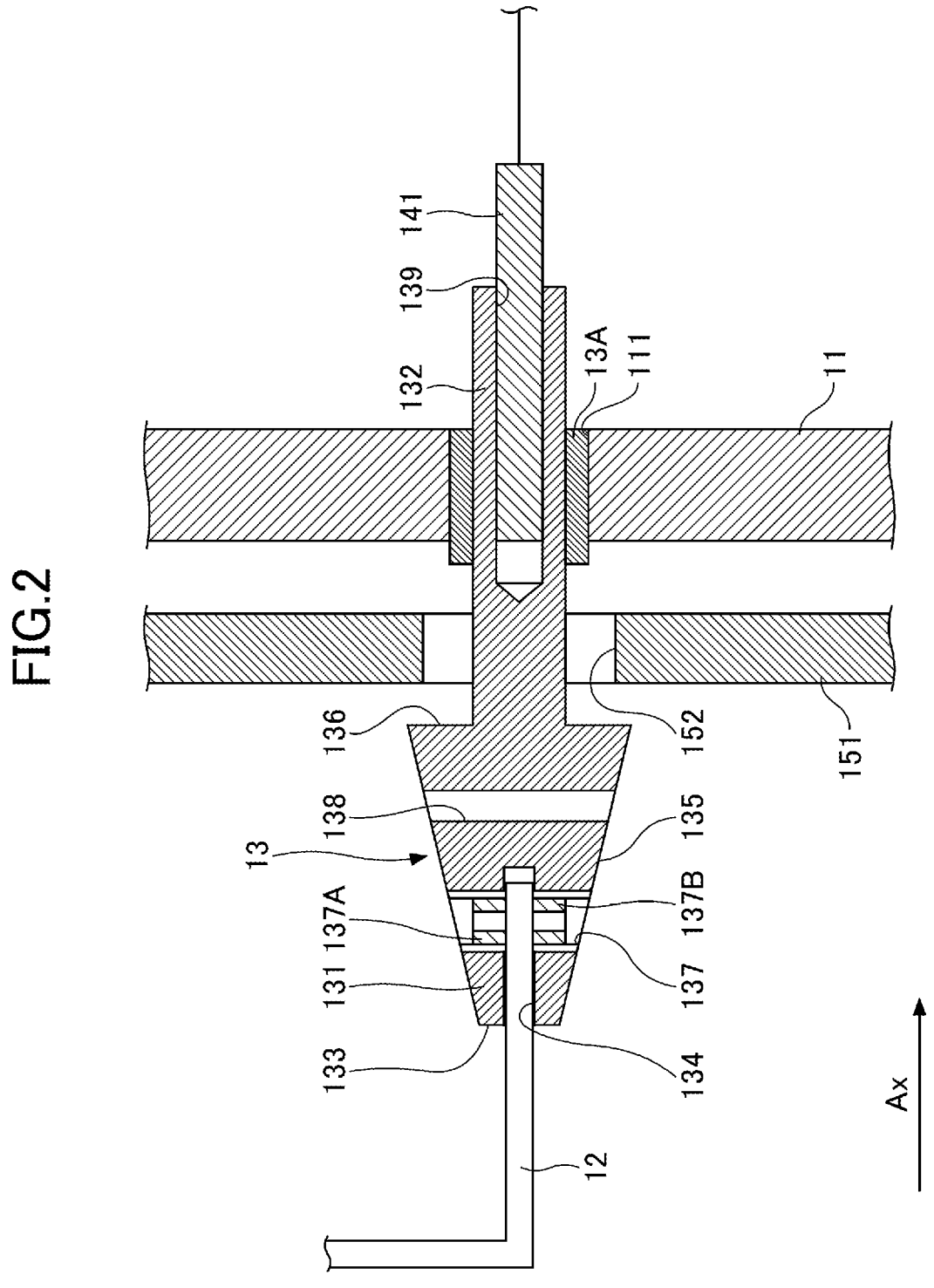
FIG. 2 is a cross-sectional view illustrating an example of a filament socket according to an embodiment of the present invention.

A filament socket, which is an electrode filament connection member, according to an embodiment will be described in detail. FIG. 2 is a cross-sectional view illustrating an example of a filament socket according to an embodiment. Two filament sockets 13 connected to respective sides of the cathode filament 12 have the same configuration. In the present embodiment, the configuration of a filament socket 13 illustrated in FIG. 2 is merely an example, and can be appropriately changed to the extent that the object of the present embodiment can be achieved. In the present embodiment, an end (a tip end portion), located inside the chamber C, of the filament socket 13 is referred to as "one end", and an end, located outside the chamber C, of the filament socket 13 is referred to as "the other end".

As used herein, the "tip end portion" refers to the tip end of the filament socket 13 or a region including the tip end of the filament socket 13 and its vicinity. As will be described later, if a head portion 131 of the filament socket 13 has a tip end surface 133, the tip end portion means the tip end surface 133. If the head portion 131 of the filament socket 13 does not have the tip end surface 133, the tip end portion refers to the tip end of the filament socket 13 and its surrounding region.

As illustrated in FIG. 2, the outer wall 11 has a socket attachment hole 111 through which the filament socket 13 passes, and the filament socket 13 is attached through the socket attachment hole 111. In the socket attachment hole 111, the insulating member 13A is interposed between the filament socket 13 and the outer wall 11. As the insulating member 13A, an insulator or the like can be used, for example. In FIG. 2, in the socket attachment hole 111 of the outer wall 11, the insulating member 13A surrounds a rod portion 132, which will be described later, of the filament socket 13 while in contact with the entire periphery of the rod portion 132. The outer periphery of the insulating member 13A is surrounded by the outer wall 11 while in contact with the outer wall 11. This configuration allows the outer wall 11 and the filament socket 13, that is, the outer wall 11 and the wire from the cathode power source 14 to be electrically insulated while maintaining airtightness in the chamber C.

The anode plate 151 has a through hole 152 through which the filament socket 13 passes. The diameter of the through hole 152 is larger than the outer diameter of the rod portion 132, which will be described later, of the filament socket 13, and the anode plate 151 is spaced apart from the rod portion 132. That is, a gap is provided between the filament socket 13 and the anode plate 151, and the filament socket 13 is attached so as not to contact the anode plate 151. The gap between the filament socket 13 and the anode plate 151 is preferably determined based on the voltage between these components such that dielectric breakdown does not occur.

The filament socket 13 includes the head portion 131 and the rod portion 132. The head portion 131 is located in the chamber C, and the cathode filament 12 is attached to the head portion 131. The rod portion 132 extends from the head portion 131 through the outer wall 11 to the outside of the chamber C, and the wire from the cathode power source 14 provided outside the chamber C is connected to the rod portion 132. In the following description, a direction in which the rod portion 132 passes through the outer wall is referred to as an axial direction Ax. In the present embodiment, the axial direction Ax is orthogonal to a portion of the inner surface of the outer wall 11 defining the chamber C, where the rod portion 132 passes through the outer wall 11 (socket attachment hole 111).

The head portion 131 includes the tip end surface 133, an electrode filament attachment portion 134, a side surface 135, a connection surface 136, a filament fixing hole 137, and a tool attachment hole 138. The tip end surface 133 is located inside the chamber C, the electrode filament attachment portion 134 is provided in the tip end surface 133, the side surface 135 extends from the tip end surface 133 toward the outer wall 11, that is, toward the outside of the chamber C, and the connection surface 136 is formed at a connecting portion between the side surface 135 and the rod portion 132.

The tip end surface 133 is a flat surface orthogonal to the axial direction Ax; however, the tip end surface 133 may be a tapered surface that widens from the electrode filament attachment portion 134 toward the side surface 135 or may be a spherical surface that projects toward the inside of the chamber C.

The tip end surface 133 may have a fine uneven pattern such as knurling. This configuration can prevent solids or the like produced in the chamber C from being deposited and developing into a large lump. Examples of the solids produced in the chamber C include, but are not limited to, a component, such as carbon, derived from the source gas. If the tip end surface 133 has a fine uneven pattern, the tip end surface 133 is an enveloping surface of the uneven pattern. Note that the depth of the fine uneven pattern from the enveloping surface is 1/10 or less and is preferably 1/20 or less of the maximum length of the filament socket 13 when viewed in projection along the direction in which the filament socket 13 is attached through the outer wall 11.

The electrode filament attachment portion 134 is a hole provided in the tip end surface 133, and the cathode filament 12 is inserted into the electrode filament attachment portion 134.

The electrode filament attachment portion 134 is not limited to a hole as illustrated in FIG. 2, and may be, for example, a hook projecting from the tip end surface 133 toward the inside of the chamber C. In this case, the cathode filament 12 may have an engagement structure corresponding to the hook. For example, the cathode filament 12 may have a hook shape or a ring shape.

The side surface 135 is gradually widened from the tip end surface 133, located inside the chamber C, toward the outer wall 11 (connection surface 136).

As illustrated in FIG. 2, the side surface 135 is preferably a continuous surface. The side surface 135 may be a tapered surface whose diameter increases from the tip end surface 133 toward the connection surface 136. When viewed from a direction orthogonal to the axial direction Ax of the filament socket 13, the side surface 135 may be a curved surface protruding outward from the tip end surface 133 toward the connection surface 136, or may be a curved surface recessed inward from the tip end surface 133 toward the connection surface 136.

As will be described later, the outer shape of the side surface 135 of the head portion 131 conforms to the outer shape of the filament socket 13 when viewed in projection along the direction in which the filament socket 13 is attached through the outer wall 11. That is, as illustrated in FIG. 2, the maximum diameter of the side surface 135 is the outer diameter of the connection surface 136, and is also the maximum diameter of the filament socket 13. With this configuration, a discontinuous recess (for example, the recess 74 of FIG. 7) can be eliminated. solids or the like produced in the chamber C can be prevented from being deposited on the surface of the filament socket 13 and developing into a large lump.

The side surface 135 may have a fine uneven pattern such as knurling. This configuration can prevent solids or the like produced in the chamber C from being deposited and developing into a large lump. If the side surface 135 has a fine uneven pattern, the side surface 135 is an enveloping surface of the uneven pattern. Note that the depth of the fine uneven pattern from the enveloping surface is 1/10 or less and preferably 1/20 or less of the maximum length of the filament socket 13 when viewed in projection along the direction in which the filament socket 13 is attached through the outer wall 11.

In the example of FIG. 2, the connection surface 136 is a flat surface connecting the end, on the outer wall 11 side, of the side surface 135 to the end, on the one end side, of the rod portion 132. The connection surface 136 is apart from the outer wall 11. Note that the shape of the connection surface 136 is not limited thereto. The connection surface 136 may have a tapered surface that narrows toward the outside of the chamber C. The connection surface 136 does not need to be a continuous surface, and may have projections and recesses.

As illustrated in FIG. 2, the filament fixing hole 137 may be provided in the side surface 135. Note that the filament fixing hole 137 is not necessarily provided, and may be provided as necessary.

The filament fixing hole 137 is a hole that crosses the hole of the electrode filament attachment portion 134 and passes through the head portion 131. The filament fixing hole 137 may be a screw hole, and the inner wall of the filament fixing hole 137 may have thread grooves. Two screw members 137A and 137B, having grooves on the outer peripheral surfaces thereof and serving as fixing members, are inserted into the filament fixing hole 137 from both sides of the filament fixing hole 137, and sandwich the cathode filament 12. The cathode filament 12 is fixed in the filament fixing hole 137 by being sandwiched between the screw members 137A and 137B.

In the present embodiment, the two screw members 137A and 137B are provided in the filament fixing hole 137; however, the cathode filament 12 may be fixed by fixing members other than the two screw members 137A and 137B. Further, the screw members 137A and 137B are not necessarily provided depending on the structure of the electrode filament attachment portion 134. For example, the screw members 137A and 137B are not necessarily provided if the electrode filament attachment portion 134 has the hook shape.

As illustrated in FIG. 2, the tool attachment hole 138 may be provided in the side surface 135. Note that the tool attachment hole 138 is not necessarily provided, and may be provided as necessary.

The tool attachment hole 138 is a hole that passes through the head portion 131. A tool for removing the filament socket 13 from the outer wall 11 is inserted into the tool attachment hole 138. If a tool is not needed to attach or remove the filament socket 13, the tool attachment hole 138 needs not necessarily be provided.

As illustrated in FIG. 2, the rod portion 132 is fixed in a state in which the rod portion 132 passes through the socket attachment hole 111 of the outer wall 11 via the insulating member 13A. The rod portion 132 has a cylindrical shape; however, the rod portion 132 may have a polygonal column shape such as a square shape, or the outer wall of the rod portion 132 may be tapered.

The rod portion 132 may have a wire connection hole 139 extending from the other end toward the one end of the filament socket 13. A terminal 141 of the wire from the cathode power source 14 may be inserted into the wire connection hole 139 such that the filament socket 13 is connected to the wire from the cathode power source 14.

Note that a connection structure between the rod portion 132 and the wire from the cathode power source 14 is not limited thereto. For example, a through hole may be provided in the side surface of the rod portion 132 and the terminal 141 of the wire may be fitted in the through hole.

As the material of the filament socket 13, an electrically conductive material is used such that the cathode filament 12 and the wire from the cathode power source 14 is electrically connected through the filament socket 13.

Figure 3:
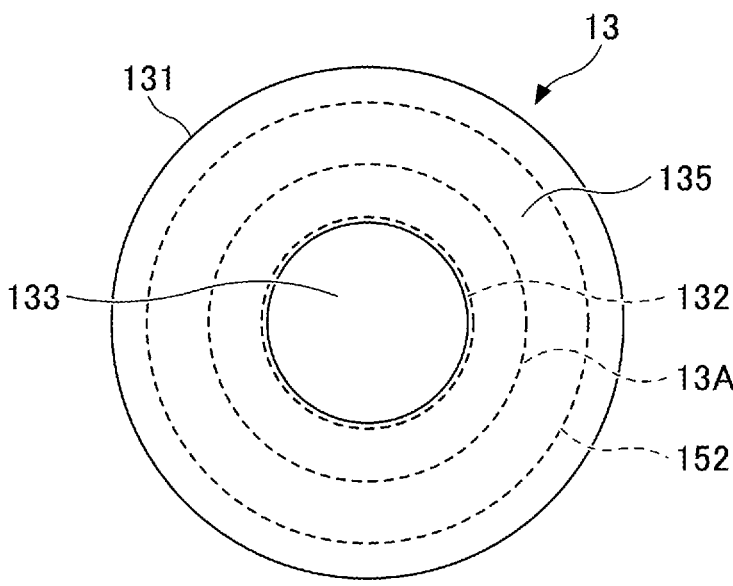
FIG. 3 is a diagram illustrating the filament socket of FIG. 2 as viewed from the inside of a chamber in an axial direction.

FIG. 3 is a diagram illustrating the filament socket 13 of FIG. 2 as viewed from the inside of the chamber C in the axial direction Ax. For the filament socket 13 illustrated in FIG. 3, lines other than the solid line indicating the head portion 131 (side surface 135) and the tip end surface 133, and the dotted lines indicating the rod portion 132, the insulating member 13A, and the through hole 152 are not depicted for convenience of description.

As illustrated in FIG. 3, the outer shape of the side surface 135 of the head portion 131 conforms to the outer shape of the filament socket 13. That is, the outer shape of the side surface 135 of the head portion 131 conforms to the outer shape of the filament socket 13 when viewed in projection along the axial direction Ax.

Note that a protruding portion, such as a reinforcing rib extending along the axial direction Ax, may be provided on part of the side surface 135 as necessary. In this case, the protruding portion is not the side surface 135, and thus, the outer shape of the filament socket 13 does not need to conform to the outer shape of the side surface 135 including the protruding portion.

With the filament socket 13 being attached through the outer wall 11, the socket attachment hole 111 of the outer wall 11 is located inward relative to the outer shape of the side surface 135 of the head portion 131. That is, with the filament socket 13 being attached through the outer wall 11, the socket attachment hole 111 is located inward relative to the outer shape of the side surface 135 (the outer shape of the side surface 135 of the head portion 131 is located outward relative to the attachment hole 11) when viewed in projection along the axial direction Ax of the socket attachment hole 111. With this configuration, the head portion 131 of the filament socket 13 serves as an umbrella that prevents solids produced in the chamber C from adhering to a portion to which the filament socket 13 is attached, specifically, to the insulating member 13A, and as a result, a short circuit between the filament socket 13 and the outer wall 11 can be suppressed.

With the filament socket 13 being attached through the outer wall 11, the through hole 152 of the anode 15 is located inward relative to the outer shape of the side surface 135 of the head portion 131. That is, with the filament socket 13 being attached through the outer wall 11, the through hole 152 is located inward relative to the outer shape of the side surface 135 of the head portion 131 when viewed in projection along the axial direction Ax of the through hole 152 of the anode 15. With this configuration, the head portion 131 of the filament socket 13 serves as an umbrella that prevents solids produced in the chamber C from entering through a gap between the rod portion 132 of the filament socket 13 and the through hole 152 of the anode plate 151 and contaminating the inner surface of the outer wall 11.

3. Filament Sockets According to Modifications

The side surface 135 of the head portion 131 can be designed to have any suitable shape as long as the filament socket 13 is formed such that solids produced in the chamber C are not deposited on the side surface 135 of the filament socket 13. In the following, filament sockets 13 according to modifications will be described.

3-1. First Modification

Figure 4:
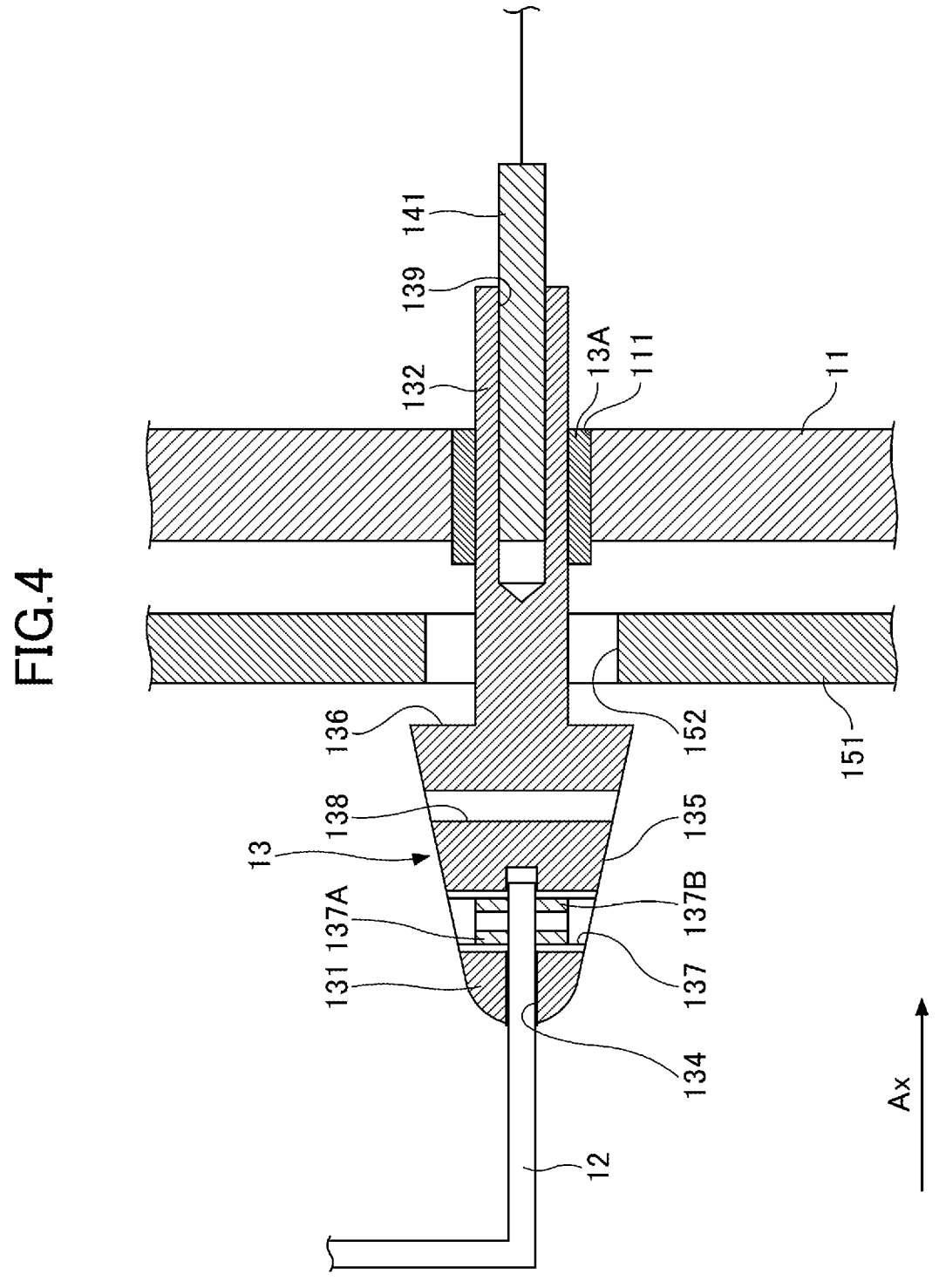
FIG. 4 is a cross-sectional view of a filament socket according to a modification of the present invention.

FIG. 4 is a cross-sectional view of a filament socket 13 according to a first modification. As illustrated in FIG. 4, in the first modification, the head portion 131 does not have a tip end surface, and a side surface 135 is gradually widened from an electrode filament attachment portion 134 toward the outer wall 11 (toward the outside of the chamber C). The electrode filament attachment portion 134 is provided at a tip end portion, specifically, at an end portion, located inside the chamber C, of the filament socket 13.

With this configuration, the edge of the tip end surface 133 (see FIG. 2) inside the chamber C can be removed, thereby preventing solids adhering to the filament socket 13 from falling off.

3-2. Second Modification

Figure 5:
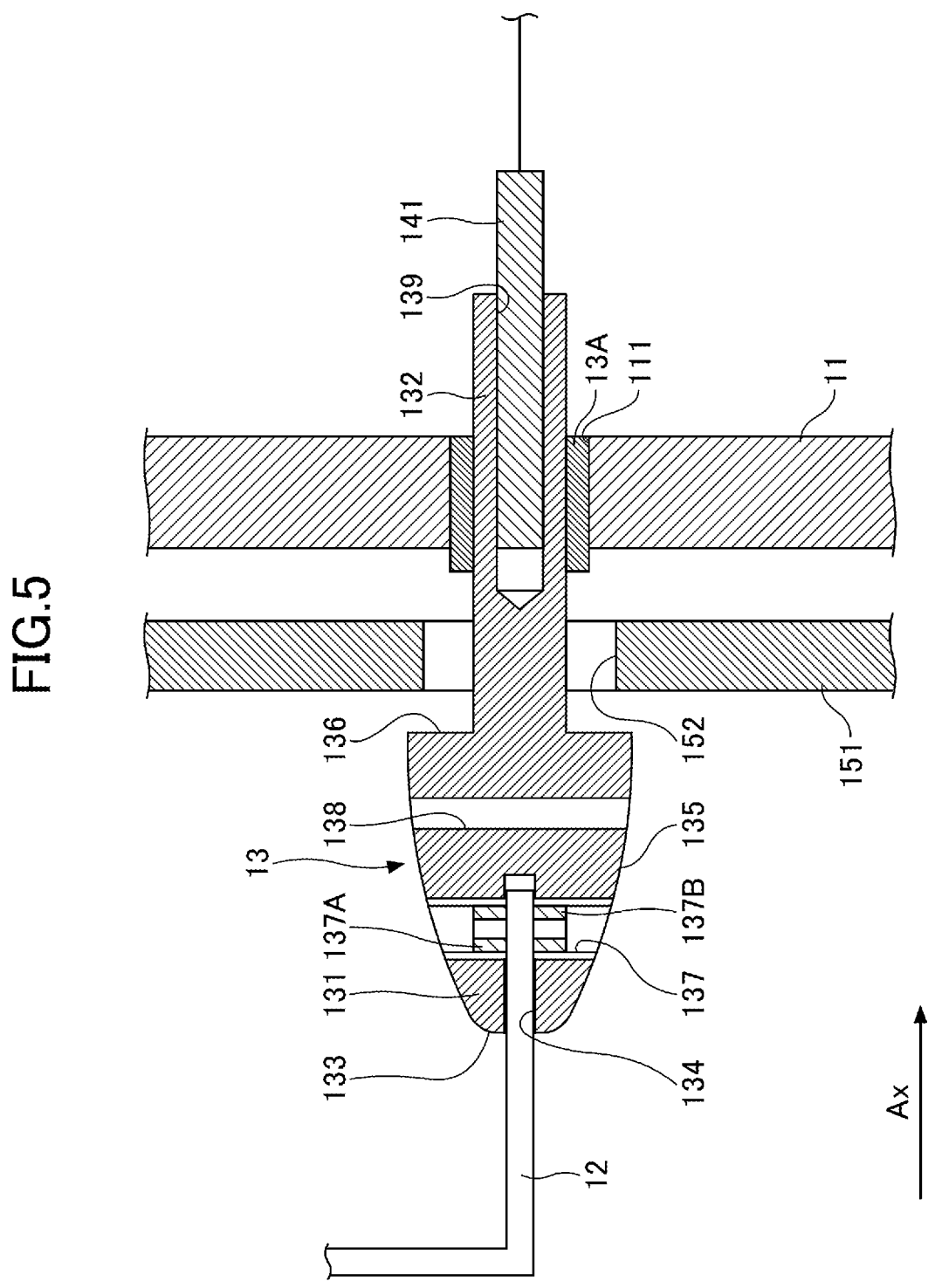
FIG. 5 is a cross-sectional view of a filament socket according to a modification of the present invention.

FIG. 5 is a cross-sectional view of a filament socket 13 according to a second modification. As illustrated in FIG. 5, in the second modification, the angle of a side surface 135 of a head portion 131 with respect to the axial direction Ax gradually decreases from a tip end surface 133 toward the outer wall 11 (toward the outside of the chamber C). That is, the side surface 135 has a curved surface that curves outward from the tip end surface 133 to a connection surface 136.

Further, an edge between the tip end surface 133 and the side surface 135 may be provided in a rounded shape or the like, such that the tip end surface 133 and the side surface 135 form a continuous surface.

Further, a part, on the rod portion 132 side (closer to the outside of the chamber C), of the side surface 135 may be a cylindrical surface that is parallel to the axial direction Ax.

Note that the angle of the side surface 135 of the head portion 131 with respect to the axial direction Ax may gradually increase from the tip end surface 133 toward the outer wall 11. That is, the side surface 135 may have a curved surface that curves inward from the tip end surface 133 to the connection surface 136.

3-3. Third Modification

Figure 6:
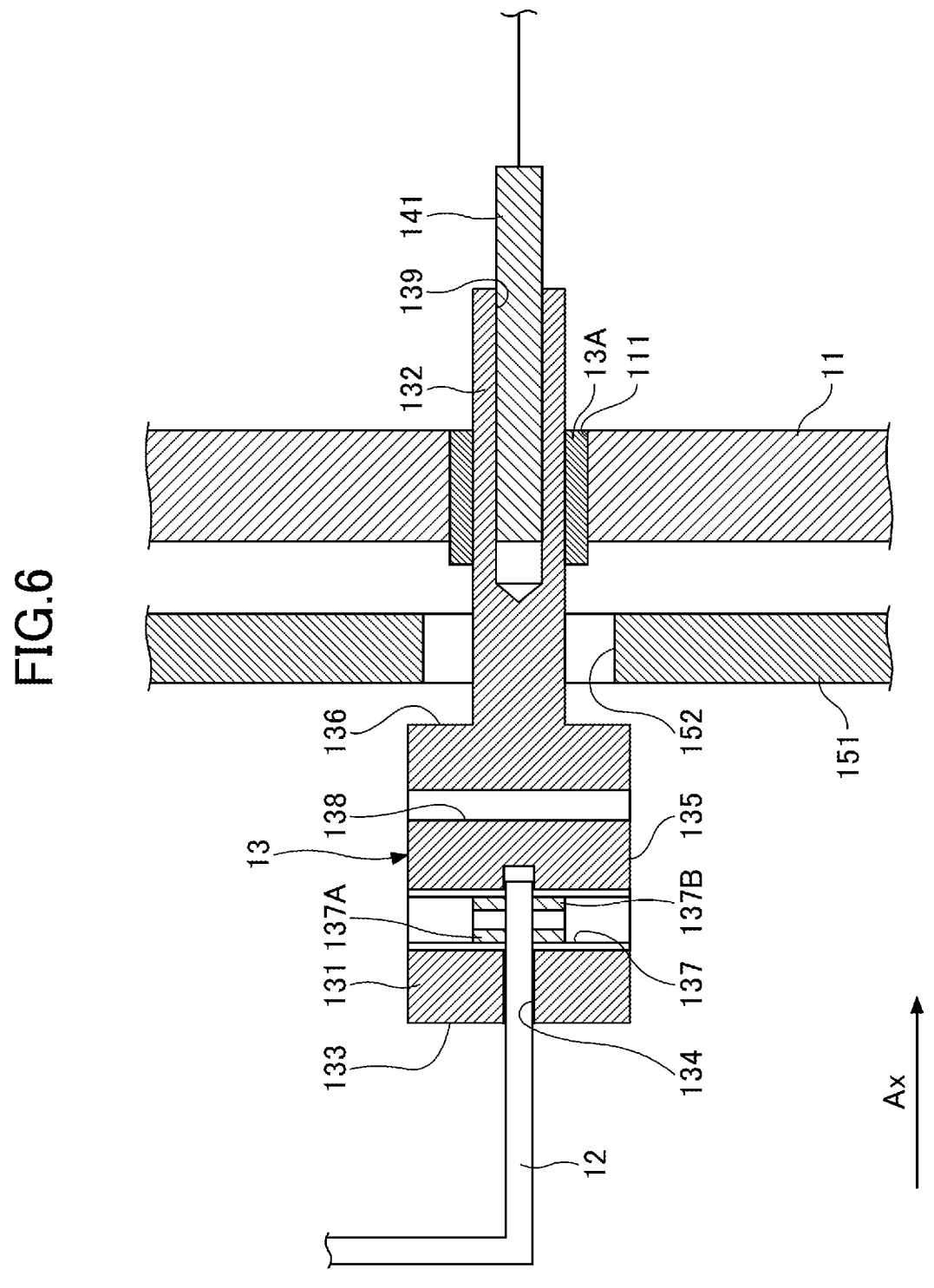
FIG. 6 is a cross-sectional view of a filament socket according to a modification of the present invention.

FIG. 6 is a cross-sectional view of a filament socket 13 according to a third modification. As illustrated in FIG. 6, in the third modification, a side surface 135 of a head portion 131 is a cylindrical surface that is parallel to the axial direction Ax. The diameter of the cylindrical surface forming the side surface 135 is larger than the diameter of the rod portion 132. Therefore, the outer shape of the side surface 135 of the head portion 131 conforms to the outer shape of the filament socket 13.

4. Method for Manufacturing Recording Medium Substrate

In a method for manufacturing a recording medium substrate according to an embodiment, a film deposition process for forming a film, including a component derived from a source gas, on the surface of a substrate W is performed by the CVD apparatus 1. As a result, a recording medium substrate used as a magnetic recording medium or the like is manufactured (the recording medium substrate may be the magnetic recording medium or the like).

5. Effects of Embodiments

The filament socket 13 according to an embodiment is attached to the CVD apparatus 1 so as to pass through the outer wall 11 of the CVD apparatus 1 in which the cathode filament 12 is provided in the chamber C defined by the outer wall 11. The filament socket 13 electrically connects the wire from the cathode power source 14 provided outside the chamber C and the cathode filament 12 provided inside the chamber C.

The filament socket 13 includes the head portion 131 that is provided in the chamber C and attached to which the cathode filament 12, and the rod portion 132 that extends from the head portion 131 through the outer wall 11 and connected to the wire from the cathode power source 14.

In the example of FIG. 2, the head portion 131 includes the electrode filament attachment portion 134 provided at the tip end portion located inside the chamber C, and the side surface 135 that is gradually widened from the tip end surface 133 toward the outer wall 11 (connection surface 136). Note that, as in the first modification, the head portion 131 does not necessarily have a tip end surface, and the side surface 135 may extend outward from the tip end portion, to which the cathode filament 12 is attached, toward the outside of the chamber C. Further, as in the second modification, the angle of side surface 135 with respect to the axial direction Ax may be changed, and part of the side surface 135 may be parallel to the axial direction Ax. Further, as in the fourth modification, the side surface 135 may be parallel to the axial direction Ax.

When the axial direction Ax is defined as a direction in which the rod portion 132 passes through the outer wall 11, the outer shape of the side surface 135 of the head portion

131 conforms to the outer shape of the filament socket 13 when viewed in projection along the axial direction Ax.

In the filament socket 13, the outer shape of the head portion 131 is larger than the outer shape of the rod portion 132 when viewed in projection along the axial direction Ax. Therefore, the head portion 131 functions as an umbrella that prevents solids produced in the chamber C from adhering to the inner surface of the outer wall 11. Accordingly, when a film is formed on the substrate W in the chamber C by the CVD method using the cathode filament 12, the filament socket 13 can prevent solids produced in the chamber C from adhering to the socket attachment hole 111 of the outer wall 11 through which the filament socket 13 is attached.

Figure 7:
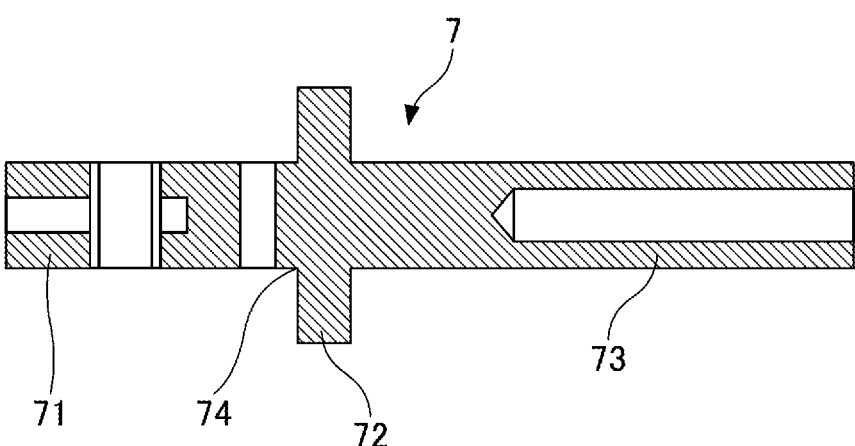
FIG. 7 is a cross-sectional view illustrating a configuration of a conventional electrode filament connection member.

Further, the filament socket 13 does not have any recess like the recess 74 between the head portion 71 and the collar portion 72 of the conventional electrode filament connection member illustrated in FIG. 7. Therefore, the filament socket 13 can prevent solids produced in the chamber C from being deposited on the head portion 131, developing into a large lump, and falling off.

The CVD apparatus 1 according to an embodiment includes the filament socket 13. Accordingly, when a film is formed on the substrate W in the chamber C by the CVD method using the cathode filament 12, the filament socket 13 can prevent solids produced in the chamber C from adhering to the socket attachment hole 111 of the outer wall 11 through which the filament socket 13 is attached. Further, because the CVD apparatus 1 includes the filament socket 13, it is possible to prevent solids produced in the chamber C from being deposited on the head portion 131, developing into a large lump, and falling off.

The method for manufacturing a recording medium substrate according to an embodiment uses the filament socket 13. Accordingly, in the method for manufacturing a recording medium substrate according to the embodiment, when a film is formed on the substrate W in the chamber C by the CVD method using the cathode filament 12, solids produced in the chamber C can be prevented from adhering to the socket attachment hole 111 of the outer wall 11 through which the filament socket 13 is attached. In addition, because the method for manufacturing a recording medium substrate according to the embodiment uses the filament socket 13, solids produced in the chamber C can be prevented from being deposited on the head portion 131, developing into a large lump, and falling off.

Accordingly, the electrode filament connection member, the CVD apparatus, and the method for manufacturing a recording medium substrate that can prevent contamination of the outer wall 11 of the chamber C and can also prevent solids produced in the chamber C from being deposited and falling off when a film is formed on the substrate W in the chamber C by the CVD method using the cathode filament 12, can be provided.

According to an embodiment, an electrode filament connection member, a CVD apparatus, and a method for manufacturing a recording medium substrate that can prevent solids produced in a chamber from being deposited and falling off when a film is formed on a substrate in the chamber by a CVD method using an electrode filament, can be provided.

Although the embodiments have been described above, the embodiments are merely examples and not to be construed as limiting the present invention. The embodiments may be implemented in various other forms, and various combinations, omissions, substitutions, modifications, or the like may be made without departing from the scope of the present invention. The embodiments and modifications thereof fall within the scope of the claimed invention and equivalents thereof.

What is claimed is:

1. An electrode filament connection member for attaching to a chemical vapor deposition apparatus so as to pass through an outer wall of the chemical vapor deposition apparatus in which an electrode filament is disposed in a chamber defined by the outer wall, said electrode filament connection member forming an electrical connection between a wire from a power source provided outside the chamber and the electrode filament, the electrode filament connection member comprising:

a head portion that is provided in the chamber and attached to the electrode filament; and a rod portion that extends from the head portion through the outer wall so as to be connected to the wire, wherein the head portion and the rod portion are integrally formed as a single component, wherein the head portion includes an electrode filament attachment portion at a tip end portion, and a side surface that is gradually widened from the tip end portion toward a connection surface that connects the side surface and the rod portion, the rod portion passing through the outer wall in the axial direction, wherein the head portion has, at the connection surface, a diameter that is greater than a diameter of the rod portion, wherein an outer shape of the side surface of the head portion conforms to an outer shape of the electrode filament connection member when viewed in projection along the axial direction, wherein the side surface has a curved surface that curves outward from the tip end portion to the connection surface, wherein the side surface is formed as a continuous surface, wherein an end of the rod portion is disposed outside the outer wall, wherein a wire connection hole to which a terminal of the wire is connected is provided at the end of the rod portion, wherein an anode plate is disposed in the chamber so as to surround the head portion, the anode plate being electrically insulated from the outer wall and having a through hole through which the electrode filament connection member passes, the through hole being located inward relative to the outer shape of the side surface of the head when viewed in projection along the axial direction, the anode plate being arranged so as not to be in direct contact with the outer wall, and wherein an insulating layer is provided between the rod portion and the outer wall so as to insulate the rod portion from the outer wall, the anode plate and the insulating layer being positioned so as not to overlap each other in the axial direction.

2. The electrode filament connection member according to claim 1, wherein the outer wall has an attachment hole, and the outer shape of the side surface of the head portion is located outward relative to the attachment hole when viewed in the projection along the axial direction, with the electrode filament connection member being attached through the attachment hole of the outer wall.

3. A chemical vapor deposition apparatus in which an electrode filament is disposed in a chamber defined by an outer wall, the chemical vapor deposition apparatus comprising:

an electrode filament connection member configured to pass through the outer wall and to electrically connect a wire from a power source provided outside the chamber and the electrode filament, wherein the electrode filament connection member includes a head portion that is provided in the chamber and attached to the electrode filament, and a rod portion that extends from the head portion through the outer wall so as to be connected to the wire, wherein the head portion and the rod portion are integrally formed as a single component, wherein the head portion includes an electrode filament attachment portion at a tip end portion, a side surface that is gradually widened from the tip end portion toward a connection surface that connects the side surface and the rod portion, the rod portion passing through the outer wall in the axial direction, wherein the head portion has, at the connection surface, a diameter that is greater than a diameter of the rod portion, wherein an outer shape of the side surface of the head portion conforms to an outer shape of the electrode filament connection member when viewed in projection along the axial direction, wherein the side surface has a curved surface that curves outward from the tip end portion to the connection surface, wherein the side surface is formed as a continuous surface, wherein an end of the rod portion is disposed outside the outer wall, wherein a wire connection hole to which a terminal of the wire is connected is provided at the end of the rod portion, wherein an anode plate is disposed in the chamber so as to surround the head portion, the anode plate being electrically insulated from the outer wall and having a through hole through which the electrode filament connection member passes, the through hole being located inward relative to the outer shape of the side surface of the head when viewed in projection along the axial direction, the anode plate being arranged so as not to be in direct contact with the outer wall, and wherein an insulating layer is provided between the rod portion and the outer wall so as to insulate the rod portion from the outer wall, the anode plate and the insulating layer being positioned so as not to overlap each other in the axial direction.

4. The electrode filament connection member according to claim 1, wherein the rod portion has a uniform diameter.

5. The electrode filament connection member according to claim 1, wherein the chemical vapor deposition apparatus is configured to perform a film deposition process on a substrate in the chamber, and a side of the anode plate that is closer to the substrate is open, and wherein the anode plate has a tapered shape that widens toward the substrate.

* * * * *